(12) United States Patent
Hasegawa et al.

(10) Patent No.: US 9,941,874 B2
(45) Date of Patent: *Apr. 10, 2018

(54) SWITCHING UNIT AND POWER SUPPLY CIRCUIT

(71) Applicant: Kabushiki Kaisha Toshiba, Minato-ku (JP)

(72) Inventors: Kohei Hasegawa, Yokohama (JP); Takenori Yasuzumi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/716,606

(22) Filed: Sep. 27, 2017

(65) Prior Publication Data

US 2018/0019743 A1    Jan. 18, 2018

Related U.S. Application Data

(63) Continuation of application No. 15/096,454, filed on Apr. 12, 2016, now Pat. No. 9,806,706.

(30) Foreign Application Priority Data

Apr. 15, 2015    (JP) .................................. 2015-083324

(51) Int. Cl.
*H03K 17/10* (2006.01)
*H02M 3/337* (2006.01)
(Continued)

(52) U.S. Cl.
CPC .......... *H03K 17/102* (2013.01); *H02M 3/337* (2013.01); *H02M 2001/0058* (2013.01); *H03K 2017/6875* (2013.01); *Y02B 70/1491* (2013.01)

(58) Field of Classification Search
CPC .......... H02M 1/32; H02M 1/08; H02M 1/088; H02M 3/155–3/1588; H02M 2001/0058; H03K 17/102
See application file for complete search history.

(56) References Cited

U.S. PATENT DOCUMENTS 4,692,643 A * 9/1987 Tokunaga ............ H03K 17/102
327/436
4,751,408 A * 6/1988 Rambert ............. H03K 17/691
327/436
(Continued)

FOREIGN PATENT DOCUMENTS

EP    2 693 639 A1    2/2014

*Primary Examiner* — Yusef Ahmed
(74) *Attorney, Agent, or Firm* — Oblon, McClelland, Maier & Neustadt, L.L.P.

(57) ABSTRACT

A switching unit of an embodiment includes a first switching element of normally-on type, a second switching element of normally-off type having a non-reference potential side conductive terminal connected to a reference potential side conductive terminal of the first switching element, a resistive element having one end connected to a conduction control terminal of the first switching element; a series capacitor connected between the other end of the resistive element and a conduction control terminal of the second switching element; and a diode having an anode connected to the other end of the resistive element and a cathode connected to a common junction of the first switching element and the second switching element.

19 Claims, 3 Drawing Sheets

(51) Int. Cl.
*H03K 17/687* (2006.01)
*H02M 1/00* (2006.01)

(56) References Cited

U.S. PATENT DOCUMENTS

| | | | | |
|---|---|---|---|---|
| 5,148,064 | A * | 9/1992 | Kevorkian | H03K 17/102 327/427 |
| 7,193,428 | B1 | 3/2007 | Baron | |
| 7,245,509 | B1 | 7/2007 | Chan | |
| 7,310,006 | B2 | 12/2007 | Shimada | |
| 7,369,421 | B1 | 5/2008 | Chan | |
| 7,492,618 | B2 | 2/2009 | Matsuda | |
| 8,487,667 | B2 * | 7/2013 | Iwamura | H03K 17/567 327/108 |
| 8,710,543 | B2 | 4/2014 | Ichikawa | |
| 9,494,964 | B2 | 11/2016 | Kawai | |
| 9,787,302 | B2 * | 10/2017 | Deng | H03K 17/6871 |
| 2004/0213026 | A1 * | 10/2004 | Park | H02M 1/088 363/132 |
| 2007/0025123 | A1 | 2/2007 | Kim | |
| 2008/0197908 | A1 * | 8/2008 | Williams | H01L 29/8128 327/431 |
| 2011/0215840 | A1 * | 9/2011 | Machida | H03K 3/00 327/109 |
| 2012/0187934 | A1 * | 7/2012 | Suzuki | H02M 3/156 323/311 |
| 2012/0280271 | A1 * | 11/2012 | Ichikawa | H03K 17/107 257/133 |
| 2012/0299624 | A1 | 11/2012 | Sugahara | |
| 2013/0076322 | A1 | 3/2013 | Tateno | |
| 2013/0193525 | A1 | 8/2013 | Weis | |
| 2013/0258721 | A1 * | 10/2013 | Boulharts | H02M 3/335 363/21.04 |
| 2013/0335134 | A1 * | 12/2013 | Kanazawa | H01L 27/0883 327/404 |
| 2014/0027785 | A1 * | 1/2014 | Rose | H03K 17/08122 257/77 |
| 2014/0055175 | A1 * | 2/2014 | Pan | H03K 17/0822 327/109 |
| 2014/0062585 | A1 * | 3/2014 | Weis | H03K 17/102 327/541 |
| 2014/0091852 | A1 | 4/2014 | Norling | |
| 2014/0232281 | A1 * | 8/2014 | Otake | H01L 27/0817 315/200 R |
| 2014/0241015 | A1 | 8/2014 | Barauna | |
| 2015/0061752 | A1 | 3/2015 | Abe | |
| 2015/0249448 | A1 * | 9/2015 | Hirler | H03K 17/567 327/432 |
| 2016/0079892 | A1 | 3/2016 | Arafat | |
| 2016/0149569 | A1 | 5/2016 | Sicard | |
| 2016/0191046 | A1 | 6/2016 | Zhao | |
| 2016/0254755 | A1 | 9/2016 | Deboy | |
| 2016/0352321 | A1 * | 12/2016 | Yamaguchi | H03K 17/162 |

* cited by examiner

SWITCHING UNIT AND POWER SUPPLY CIRCUIT

This application is a continuation application of U.S. application Ser. No. 15/096,454, filed Apr. 12, 2016, and claims priority to Japanese Priority Application No. 2015-083324 filed Apr. 15, 2015. The entire contents of the above-identified applications are incorporated herein by reference.

FIELD OF THE INVENTION

Embodiments of the present invention relate to a switching unit including, in series, a normally-on type switching element and a normally-off type switching element, and also relate to a power supply circuit provided with the switching unit.

DESCRIPTION OF THE RELATED ART

Devices like a bipolar transistor or a FET are used as a switching element in a power conversion circuit such as an inverter or a converter. The FET includes a normally-off FET, which is turned on when a drive voltage is applied between the gate and the source, and a normally-on FET, which is on when no drive voltage is applied between the gate and the source, at 0 V. For example, Gallium Nitride•High Electron Mobility Transistors (GaN•HEMTs) are normally-on PET in most cases, and they have high voltage endurance and can operate at high speeds.

Normally-off type elements are used in a power supply circuit or other circuitry in terms of safety and reduction of the number of elements powered by the power supply incorporated in the system. In using a normally-on type switching element, it is usually connected in series with a normally-off type switching element with the source of the normally-off type switching element connected to the gate of the normally-on type switching element to thereby operate the normally-on type switching element as a normally-off type switching element.

In that case, the gate potential of the normally-off type element relatively decreases as the potential rises at the junction of the source of the normally-on type element and the drain of the normally-off type element, and thus this switches the element. The circuit can operate more stably if the gate potential of the normally-on type element can be relatively reduced (e.g., refer to European Patent No. 2693639). It is feared, however, that this can cause instability in the operation of the normally-on type element or application of an overvoltage to it.

DETAILED DESCRIPTION OF THE EMBODIMENTS

A switching unit of an embodiment includes:
a first switching element of normally-on type;
a second switching element of normally-off type having a non-reference potential side conductive terminal connected to a reference potential side conductive terminal of the first switching element;
a resistive element having one end connected to a conduction control terminal of the first switching element;
a series capacitor connected between the other end of the resistive element and a conduction control terminal of the second switching element; and
a diode having an anode connected to the other end of the resistive element and a cathode connected to a common junction of the first switching element and the second switching element.

First Embodiment

Figure 1:
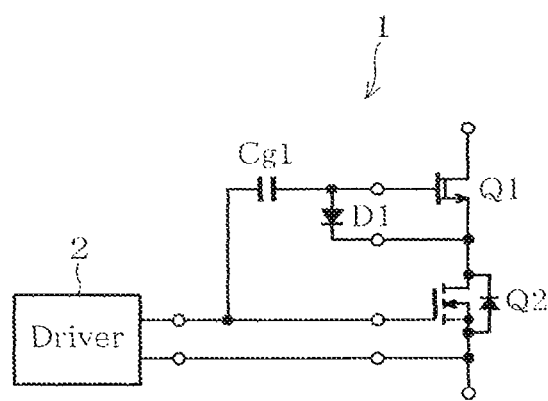
FIG. 1 is a circuit diagram of a switching unit showing a first embodiment.
Figure 2:
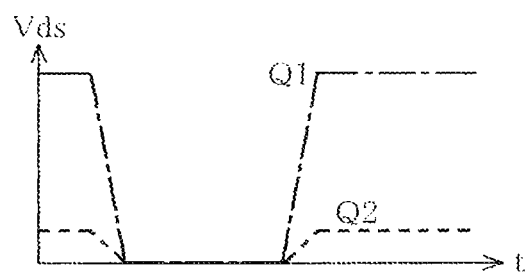
FIG. 2 is a timing diagram showing changes in drain-source voltages Vds of switching elements Q1 and Q2.
Figure 3:
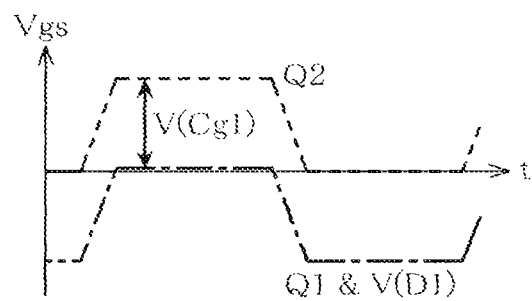
FIG. 3 is a timing diagram showing changes in gate-source voltages Vgs of the switching elements Q1 and Q2.

Hereinafter, a first embodiment will be described with reference to FIGS. 1 to 3. FIG. 1 shows an electrical configuration of a switching unit. A switching unit 1 includes a series circuit (a cascode connection) of a normally-on type switching element Q1, such as a HEMT, and a normally-off type switching element Q2, such as an n-channel MOSFET. The switching elements Q1 and Q2 are driven by a driver 2. A low-side output terminal of the driver 2 is connected to a source (a reference potential side conductive terminal) of the switching element Q2. A high-side output terminal of the driver 2 is directly connected to a gate (a conduction control terminal) of the switching element Q2, and also connected via a capacitor Cg1 to a gate of the switching element Q1. An anode and a cathode of a diode D1 are respectively connected to the gate and the source of the switching element Q1.

Here, the capacitance of the capacitor Cg1 is set to be at least larger than the input capacitance of the switching element Q1. In addition, the capacitance of the capacitor Cg1 is desirably set as large as possible so that the switching element Q1 never malfunctions due to dissipation of electrical charge in the capacitor Cg1 in the event of leakage current of the switching elements Q1 and Q2 or when the voltage across a drain of the element Q1 and the source of the element Q2 falls to 0 V due to an external factor. In this way, the use of the large-capacitance capacitor allows to apply a voltage that variates more than required for driving the switching element Q2 as the gate-source voltage of the switching element Q1.

Next, operation of the embodiment will be described also referring to FIGS. 2 and 3. FIG. 2 is a timing diagram showing changes in drain (a non-reference potential side conductive terminal)—source voltages Vds of the switching elements Q1 and Q2. In the figure, the dash-dotted line and the dashed line respectively show the changes in the switching elements Q1 and Q2. FIG. 3 is a timing diagram showing changes in gate-source voltages Vgs corresponding to the changes in FIG. 2. In the figure, the dash-dotted line and the dashed line respectively show the changes in the switching elements Q1 and Q2 similarly to FIG. 2. For the sake of simplicity, it is assumed that there is a potential difference across the capacitor Cg1 in advance that is equivalent to a drive voltage of the switching element Q1 and a gate potential of the switching element Q1 is lower than a potential on the side of the capacitor Cg1 closer to the driver 2.

First, a description will be given to a case where the driver 2 inputs a voltage to turn on the switching element Q2 into the switching unit 1, namely, turn-on. It is to be noted that even in an off state where the drive voltage of the driver 2 is at a low level, the drain-source voltage Vds of the switching element Q2, whose output capacitance is charged, is shown at a predetermined potential greater than 0 V.

At turn-on, where the drive voltage of the driver 2 reaches a high level, the capacitor Cg1 attempts to maintain the charged voltage at the point, thereby raising the gate potential of the switching element Q1. Then, the potential difference of the gate-source voltage Vgs of the switching element Q1 is eliminated. Although the voltage Vgs of the switching element Q1 can change to positive polarity in some cases, the diode D1 is then turned on to prevent the voltage Vgs from exceeding a forward voltage of the diode D1.

The driver 2 keeps applying a voltage (high level) to keep the switching element Q2 on for a period of time after the turn-on. The capacitance of the capacitor Cg1 is set so that the terminal voltage of the capacitor Cg1 never drops largely with the dissipation of the charge due to, for example, leakage current of the switching elements Q1 and Q2.

Subsequently, a description will be given to a case where the driver 2 inputs a voltage (low level) of 0 V to turn off the switching element Q2, namely, turn-off. Similarly to the case of turn-on, the capacitor Cg1 attempts to maintain the charged voltage, thereby reducing the gate potential of the switching element Q1. At that time, a reverse bias voltage is applied to the diode D1, so that a negative voltage is applied between the gate and the source of the switching element Q1. Accordingly, the normally-on type switching element Q1 transitions to the off state. After that, the off state is maintained for a period of time. Similarly to the on state, the capacitance of the capacitor Cg1 is set so that the switching element Q1 is not turned on with the dissipation of the charge of the capacitor due to, for example, leakage current.

As described above, according to the embodiment, the normally-on type switching element Q1 and the normally-off type switching element Q2 are connected in series. The capacitor Cg1 is connected between the gate of the switching element Q1 and the gate of the switching element Q2. Then, the diode D1 whose anode is connected to the gate of the switching element Q1 and whose cathode is connected to the common junction of the switching elements Q1 and Q2, thereby forming the switching unit 1.

This allows to appropriately control turning on and off the circuit including a combination of the switching elements Q1 and Q2 while protecting the switching element Q1 from an overvoltage by clamping the gate-source voltage Vgs of the switching element Q1 with the diode D1.

Second Embodiment

Figure 4:
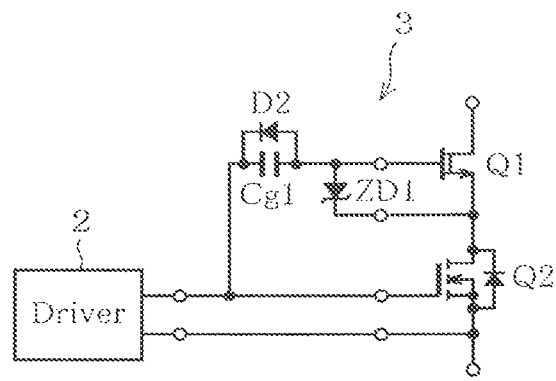
FIG. 4 is a diagram similar to FIG. 1 showing a second embodiment.

FIG. 4 shows a second embodiment in which like components to those in the first embodiment are indicated by the same reference characters and explanations thereof will be omitted. Hereinafter, different components to those in the first embodiment will be described. In the switching unit 3 of the second embodiment, the diode D1 of the first embodiment is replaced with a Zener diode ZD1 and a diode D2 is connected in parallel with the capacitor Cg1. The anode and the cathode of the diode D2 are respectively connected to the gates of the switching elements Q1 and Q2.

A Zener voltage Vz of the Zener diode ZD1 is set to be greater than a threshold voltage of the switching element Q1 and equal to or lower than a withstand voltage of the gate-source voltage Vgs of the switching element Q1. This allows to operate the switching element Q1 at a proper drive voltage while protecting the switching element Q1 from an overvoltage.

It is also required for protecting the switching element Q2 that the sum of the Zener voltage Vz and a forward voltage Vf of the diode D2 is at least equal to or lower than a withstand voltage of a drain-source voltage Vds of the switching element Q2. In the off state, where a voltage is applied between the drain and the source of the switching element Q2, the driver 2 inputs a voltage lower than the threshold voltage to the gate of the switching element Q2. At that time, a voltage (Vz+Vf) and an output voltage of the driver 2 are applied between the drain and the source of the switching element Q2. The switching element Q2 can be protected as long as the output voltage is equal to or lower than the withstand voltage of the voltage Vds.

As described above, according to the second embodiment, the switching unit 3 includes the Zener diode ZD1 connected between the gate and source of the switching element Q1 and the diode D2 which is connected in parallel with the capacitor Cg1 and whose anode is connected to the gate of the switching element Q1. This allows to keep the drain-source voltage Vds of the switching element Q2 equal to or lower than the withstand voltage to protect the switching element Q2.

Third Embodiment

Figure 5:
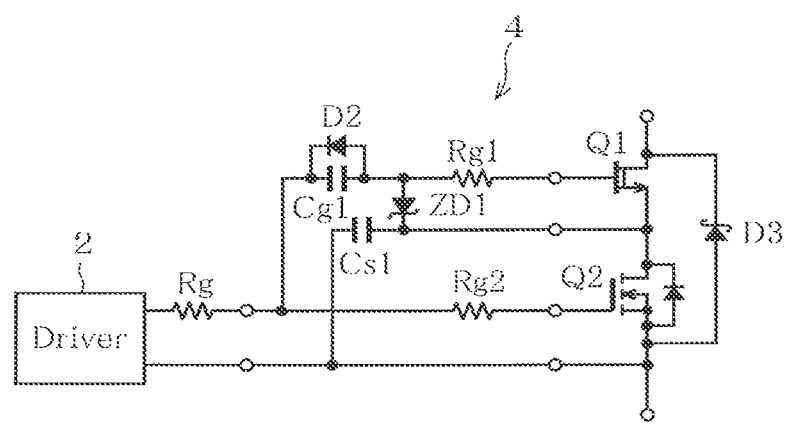
FIG. 5 is a diagram similar to FIG. 1 showing a third embodiment.

A switching unit 4 of a third embodiment shown in FIG. 5 includes a resistive element Rg1 inserted at the gate of the switching element Q1 and a series circuit of resistive elements Rg and Rg2 connected between the high-side output terminal of the driver 2 and the gate of the switching element Q2. The switching unit 4 also includes a Schottky barrier diode D3, a flywheel diode, connected in parallel with the series circuit of the switching elements Q1 and Q2. The switching unit 4 also includes a capacitor Cs1 connected in parallel with the switching element Q2. The resistive elements Rg1, Rg, and Rg2 are each placed for preventing false firing and adjusting the switching speed. The capacitor Cs1 is placed for adjusting the capacitance of the switching element Q2 and stabilizing the operation of the switching element Q2.

As described above, according to the third embodiment, the resistive element Rg1 is inserted at the gate of the switching element Q1 and the series circuit of the resistive elements Rg and R are connected between the high-side output terminal of the driver 2 and the gate of the switching element Q2. This allows to prevent false firing of the switching elements Q1 and Q2 as well as adjusting the switching speed of the switching unit 4 with resistance values of these resistive elements.

Also, the Schottky barrier diode D3 is connected in parallel with the series circuit of the switching elements Q1 and Q2, thereby conducting return current at turn-off in the switching operation of the switching unit 4.

Fourth Embodiment

Figure 6:
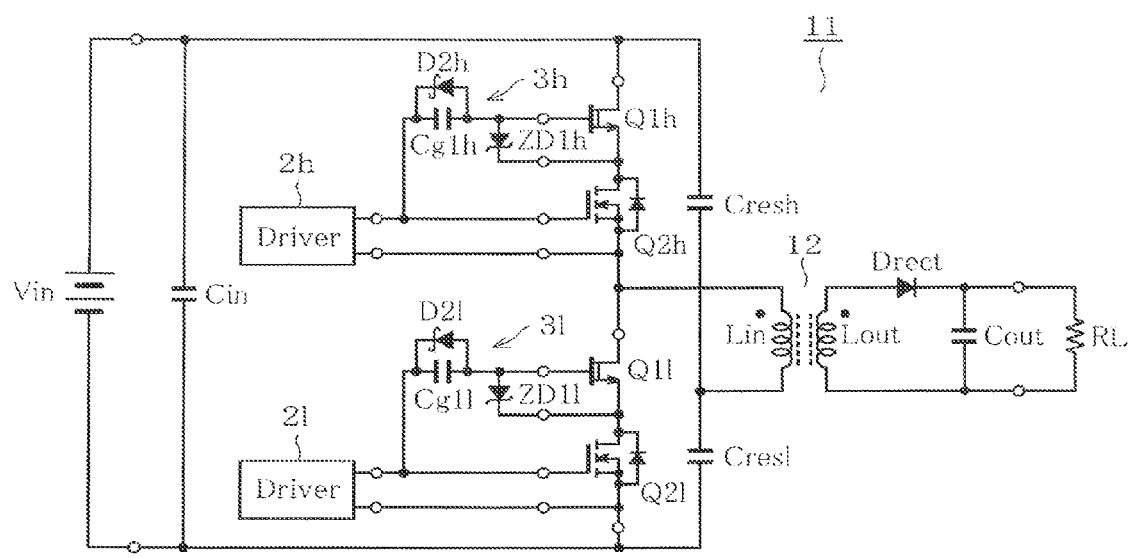
FIG. 6 is a circuit diagram of an LLC converter showing a fourth embodiment.

A fourth embodiment shown in FIG. 6 is a half-bridge LLC converter 11 (a switching power supply circuit) formed by using the switching unit 3 and the driver 2 of the second embodiment. It is to be noted that the diode D2 is replaced with a Schottky barrier diode. A capacitor Cin is connected in parallel with an input power source Vin, and also a series of switching units 3h and 3l is connected in parallel with the input power source Vin. Further, a series circuit of capacitors Cresh and Cresl is connected in parallel with the input power source Vin.

A primary coil Lin of a transformer 12 is connected between a common junction of switching elements Q2h and Q1l and a common junction of the capacitors Cresh and Cresl. A series circuit of a diode Drect and a capacitor Cout is connected across a secondary coil Lout of the transformer 12. The capacitor Cout is connected to a resistive element RL that indicates a load.

Assume that a similar LLC converter is formed from the switching unit 1 shown in FIG. 1 with the capacitor Cg1 and the diode D1 removed, for example. In that case, a gate-source voltage Vgs of a switching element Q1h or Q1l increases, possibly causing a loss due to self turn-on. That is, if a voltage between the drain of the switching element Q1 and the source of the switching element Q2 falls to 0 V while one or both of the cascode connected switching elements Q1 and Q2 in the switching units 3h and 3l are in the off state, electrical charge in the switching elements will be discharged. This turns on the switching element Q1 to conduct a drain current, thereby causing self turn-on loss.

In contrast, the LLC converter 11 suppresses changes in the gate-source voltage Vgs of the switching element Q1, thereby preventing self turn-on.

As described above, according to the fourth embodiment, the switching units 3h and 3l and the drivers 2h and 2l are used to form the LLC converter 11 that generate a supply voltage of a predetermined level by performing a switching operation using them. This prevents self turn-on loss to improve the efficiency of the LLC converter 11.

Other Embodiments

The configuration of the second embodiment may additionally include a capacitor Cs1.

Zener diodes may be used instead of the diodes D1 to D3. Also, a diode may be used instead of the Schottky barrier diode D3.

The diode D2 may be replaced with a resistive element.

A resistive element may be connected in parallel with the capacitor Cs1.

In the third embodiment, the diode D3 may be provided as needed. Also, the first and second embodiments may include the diode D3 as needed.

The present invention is not limited to the LLC converter 11 in the fourth embodiment, but may be formed in a full-bridge type. Alternatively, the present invention may be applied to other forms of switching power supply circuits.

Transistors for the switching elements Q1 and Q2 may be of any kind as long as the switching elements Q1 and Q2 are respectively of normally-on type and normally-off type.

While some embodiments of the present invention has been described, these embodiments are merely examples and not intended to limit the scope of the invention. These novel embodiments can be implemented in other various forms, and various omissions, substitutions, and changes may be made without departing from the gist of the invention. These embodiments and modifications thereof are included in the scope and the gist of the present invention, and also in the scope of the invention as claimed and equivalents thereof.

We claim:

1. A switching unit comprising:
a first switching element of normally-on type;
a second switching element of normally-off type having a non-reference potential side conductive terminal directly connected to a reference potential side conductive terminal of the first switching element;
a resistive element having one end directly connected to a conduction control terminal of the first switching element;
a series capacitor connected between the other end of the resistive element and a conduction control terminal of the second switching element; and
a first diode having an anode directly connected to the other end of the resistive element and a cathode directly connected to a common junction of the first switching element and the second switching element.

2. The switching unit according to claim 1, further comprising a parallel capacitor connected in parallel with the second switching element.

3. The switching unit according to claim 2, further comprising a resistive element connected between the conduction control terminal of the second switching element and the series capacitor.

4. The switching unit according to claim 3, further comprising a resistive element in a path in which a high-potential chive signal is input to the series capacitor.

5. The switching unit according to claim 3, further comprising a third diode being connected in parallel with the series circuit of the first and second switching elements and having a cathode connected to a non-reference potential side conductive terminal of the first switching element and an anode connected to a reference potential side conductive terminal of the second switching element.

6. The switching unit according to claim 2, further comprising a resistive element in a path in which a high-potential drive signal is input to the series capacitor.

7. The switching unit according to claim 6, further comprising a third diode being connected in parallel with the series circuit of the first and second switching elements and having a cathode connected to a non-reference potential side conductive terminal of the first switching element and an anode connected to a reference potential side conductive terminal of the second switching element.

8. The switching unit according to claim 2, further comprising a third diode being connected in parallel with the series circuit of the first and second switching elements and having a cathode connected to a non-reference potential side conductive terminal of the first switching element and an anode connected to a reference potential side conductive terminal of the second switching element.

9. The switching unit according to claim 1, wherein
the first diode is a Zener diode, and
the switching unit further includes, in parallel with the series capacitor, a second diode whose anode is connected to the other end of the resistive element.

10. The switching unit according to claim 9, further comprising a resistive element connected between the conduction control terminal of the second switching element and the series capacitor.

11. The switching unit according to claim 10, further comprising a third diode being connected in parallel with the series circuit of the first and second switching elements and having a cathode connected to a non-reference potential side conductive terminal of the first switching element and an anode connected to a reference potential side conductive terminal of the second switching element.

12. The switching unit according to claim 9, further comprising a resistive element in a path in which a high-potential drive signal is input to the series capacitor.

13. The switching unit according to claim 9, further comprising a third diode being connected in parallel with the series circuit of the first and second switching elements and having a cathode connected to a non-reference potential side conductive terminal of the first switching element and an anode connected to a reference potential side conductive terminal of the second switching element.

14. The switching unit according to claim 1, further comprising a resistive element connected between the conduction control terminal of the second switching element and the series capacitor.

15. The switching unit according to claim 14, further comprising a resistive element in a path in which a high-potential drive signal is input to the series capacitor.

16. The switching unit according to claim 14, further comprising a third diode being connected in parallel with the series circuit of the first and second switching elements and having a cathode connected to a non-reference potential side conductive terminal of the first switching element and an anode connected to a reference potential side conductive terminal of the second switching element.

17. The switching unit according to claim 1, further comprising a resistive element in a path in Which a high-potential drive signal is input to the series capacitor.

18. The switching unit according to claim 17, further comprising a third diode being connected in parallel with the series circuit of the first and second switching elements and having a cathode connected to a non-reference potential side conductive terminal of the first switching element and an anode connected to a reference potential side conductive terminal of the second switching element.

19. The switching unit according to claim 1, further comprising a third diode being connected in parallel with the series circuit of the first and second switching elements and having a cathode connected to a non-reference potential side conductive terminal of the first switching element and an anode connected to a reference potential side conductive terminal of the second switching element.

* * * * *